(12) United States Patent
Hardinger et al.

(10) Patent No.: US 8,507,047 B2
(45) Date of Patent: Aug. 13, 2013

(54) METHOD AND SYSTEM FOR MANUFACTURING PHOTO-LUMINESCENT WAVELENGTH CONVERSION COMPONENT

(75) Inventors: David A. Hardinger, San Jose, CA (US); Charles Edwards, Pleasanton, CA (US)

(73) Assignee: Intematix Corporation, Fremont, CA (US)

( * ) Notice: Subject to any disclaimer, the term of this patent is extended or adjusted under 35 U.S.C. 154(b) by 120 days.

(21) Appl. No.: 13/273,201

(22) Filed: Oct. 13, 2011

(65) Prior Publication Data

US 2013/0093311 A1    Apr. 18, 2013

(51) Int. Cl.
*B05D 3/04*        (2006.01)
*B05C 13/02*      (2006.01)
*B05C 11/00*      (2006.01)

(52) U.S. Cl.
USPC ............... 427/466; 427/335; 118/58; 118/64

(58) Field of Classification Search
CPC ...... H01J 2329/00; H01L 51/0096; B41J 2/01

USPC ................... 347/100, 101, 106; 427/66, 402; 438/14; 118/728–729
See application file for complete search history.

(56) References Cited

U.S. PATENT DOCUMENTS

2006/0029740 A1 *   2/2006   Sakurai et al. ............... 427/335

* cited by examiner

*Primary Examiner* — Tracie Y Green
(74) *Attorney, Agent, or Firm* — Vista IP Law Group, LLP

(57) ABSTRACT

An approach is described for manufacturing wavelength conversion components for lighting devices which employ in-line process controls to minimize the amount of perceptible variation in the amount of photo-luminescent material that is deposited in the wavelength conversion components. Weight measurements are utilized in the manufacturing process to control and minimize the amount of the variations. In this approach, the weight of the product during manufacturing is used as a surrogate to a measure of the amount of photo-luminescent material in the component, and hence a surrogate for the expected color properties of the manufactured product. By measuring and checking for weight variations for the component, one can quickly determine with reasonable confidence whether there are any variations in the amount of photo-luminescent in the component.

19 Claims, 11 Drawing Sheets

METHOD AND SYSTEM FOR MANUFACTURING PHOTO-LUMINESCENT WAVELENGTH CONVERSION COMPONENT

FIELD

This disclosure relates to solid-state light emitting devices that use a remotely positioned photo-luminescent wavelength conversion component to generate a desired color of light. More particularly, though not exclusively, the invention concerns approaches for manufacturing wavelength conversion components for solid-state devices based on LEDs (light emitting diodes).

BACKGROUND

White light emitting LEDs ("white LEDs") are known and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo luminescent materials, which absorb a portion of the radiation emitted by the LED and re-emit light of a different color (wavelength).

Due to their long operating life expectancy (>50,000 hours) and high luminous efficacy (70 lumens per watt and higher) high brightness white LEDs are increasingly being used to replace conventional fluorescent, compact fluorescent and incandescent light sources.

Typically the phosphor material is mixed with a silicone or epoxy material and the mixture applied to the light emitting surface of the LED die. It is also known to provide the photo luminescent material as a layer on, or incorporate the phosphor material within, an optical component, a phosphor wavelength conversion component, that is located remotely to the LED die.

The color of the light generated by a light source, in particular LEDs, is determined predominantly by the device architecture and materials selection used to generate the light. As previously noted, many LEDs incorporate one or more phosphor materials, which are photo-luminescent materials, which absorb a portion of the radiation emitted by the LED chip/die and re-emit radiation of a different color (wavelength). This is the state of the art in the production of "white" LED light sources.

Typically, the LED chip or die generates blue light and the phosphor(s) absorb a percentage of the blue light and re-emits yellow light or a combination of green and red light, green and yellow light or yellow and red light. The portion of the blue light generated by the LED that is not absorbed by the phosphor is combined with the light emitted by the phosphor and provides light which appears to the human eye as being nearly white in color.

For these types of LED lights, the exact color of the resulting light is determined by the amount of blue light that is absorbed by the phosphor material in the wavelength conversion component, with more phosphor that is present resulting in more blue light that is absorbed. Therefore, as between any two LED lights having the exact same configuration, any variation in the amount of phosphor in the two lighting devices will cause a variation in the color emitted by these lighting devices.

The problem is that typical process control variations during the manufacture of the wavelength conversion component may very well result in differing amounts of photo-luminescent materials that is deposited within the wavelength conversion component. If the variation in photo-luminescent amounts is sufficiently large, this may result in visually perceptible differences between the light colors of lighting devices that include these wavelength conversion components. Such visually distinctive color differences are unacceptable for many commercial uses, particularly for the high-end lighting that often employ LED lighting devices.

Prior approaches to address this problem have generally proved unsatisfactory. For example, one possible solution is to perform color measurements on the wavelength conversion components after they have been manufactured. By performing these color measurements on each of the wavelength conversion components, one can determine whether the wavelength conversion component has a color that is within specification, which can then identified to be removed and discarded prior to its shipment to a customer.

The issue with this approach is that it requires individual color measurements for the wavelength conversion components, which can consume a significant and costly amount of time and effort on a per-component basis. This renders the approach unsuitable for most manufacturing environments that need to process the components on a large volume basis. Moreover, this approach can only be employed at the end of the manufacturing process, after the component has been manufactured. This delays identification of potential problems until very late in the manufacturing process which can be a significant problem, particularly for multi-stage manufacturing processes for multi-layered wavelength conversion components.

Therefore, there is a need for an improved manufacturing approach that reduces or eliminates perceptible manufacturing variations in the amount of phosphor that is deposited in a wavelength conversion component.

SUMMARY OF THE INVENTION

Embodiments of the invention pertain to an approach for manufacturing wavelength conversion components for lighting devices which employ in-line process controls to minimize perceptible variation in the amount of photo-luminescent material that is deposited in the wavelength conversion components. Some embodiments of the invention utilize weight measurements in the manufacturing process to control and minimize the amount of the variations. In this approach, the weight of the product during manufacturing is used as a surrogate to a measure of the amount of photo-luminescent material in the component, and hence a surrogate for the expected color properties of the manufactured product. By measuring and checking for weight variations for the component, one can quickly determine with reasonable confidence whether there are any variations in the amount of photo-luminescent in the component.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood methods for manufacturing wavelength conversion components in accordance with the invention will now be described, by way of example only, with reference to the accompanying drawings in which like reference numerals are used to denote like parts, and in which.

DETAILED DESCRIPTION OF THE INVENTION

Embodiments of the invention pertain to an approach for manufacturing wavelength conversion components for lighting devices which employ in-line process controls to minimize perceptible variation in the amount of photo-luminescent material that is deposited in the wavelength conversion components. For the purposes of illustration, the following description is made with reference to photo-luminescent material embodied specifically as phosphor materials. However, the invention is applicable to the manufacture of wavelength conversion components having any type of any type of photo-luminescent material, such as either phosphor materials or quantum dots. As such, the invention is not limited to phosphor based wavelength conversion components unless claimed as such.

As previously noted, variations in the amount of photo-luminescent material within the wavelength conversion components will result in color variations in the lighting devices that employ these wavelength conversion components. During the manufacturing process, the photo-luminescent material is typically mixed with a light transmissive carrier material to form a mixture (e.g. an ink mixture which is also referred to herein as "ink") that is then deposited onto a substrate and then cured to form the wavelength conversion component. Because the photo-luminescent exists in a specific concentration within the ink, this means that any variation in the amount of ink that is deposited on the substrate will correspondingly result in a variation in the amount of photo-luminescent on the resulting wavelength conversion component. Therefore, any variation in the thickness of the deposited ink on the substrate will cause a color shift in any lighting apparatus that includes the wavelength conversion component. If the variation is sufficiently large, this could result in perceptible differences in the color of the resulting light.

Embodiments of the invention utilize weight measurements in the manufacturing process to control and minimize the amount of the variations. In this approach, the weight of the product during manufacturing is used as a surrogate to a measure of the amount of photo-luminescent material in the component, and hence a surrogate for the expected color properties of the manufactured product. By measuring and checking for weight variations between the components, one can quickly determine with reasonable confidence whether there are any variations in the amount of photo-luminescent material between components. Because weight measurements can easily and efficiently be made, this means that this approach can be used even in the middle of a multi-part manufacturing process, allowing for in-line process control over the manufacturing of the wavelength conversion components. Moreover, this means that the present approach can economically be used in commercial manufacturing environments, even for large-scale manufacturing enterprises.

Figure 1A:
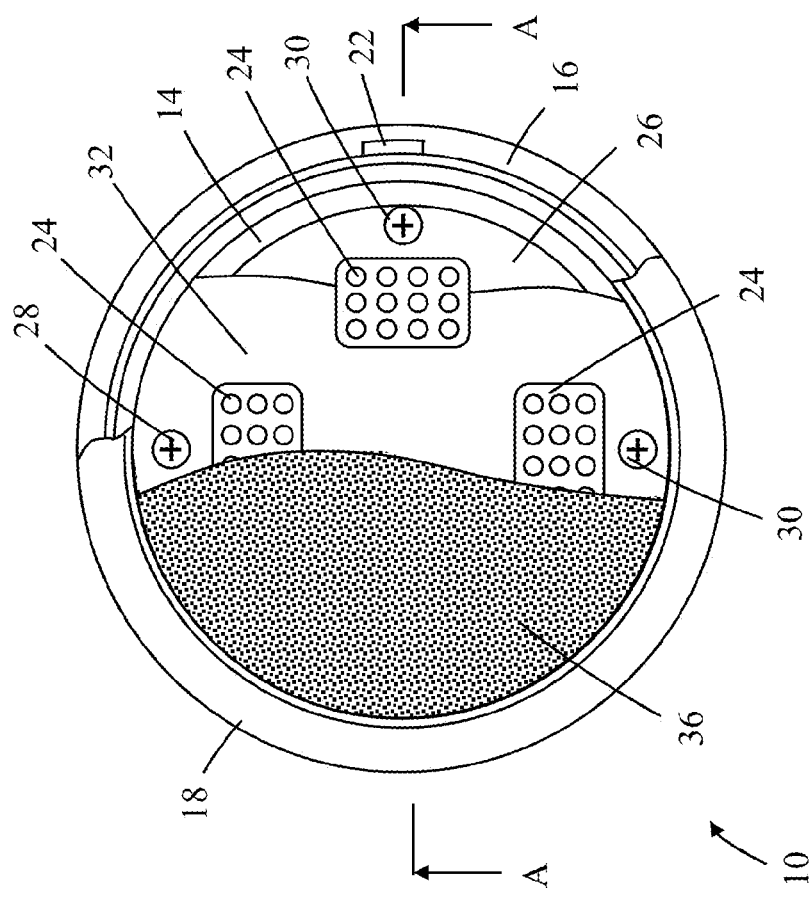
FIG. 1A-B shows schematic partial cutaway plan and sectional views of a solid-state light emitting device in accordance with an embodiment of the invention.
Figure 1B:
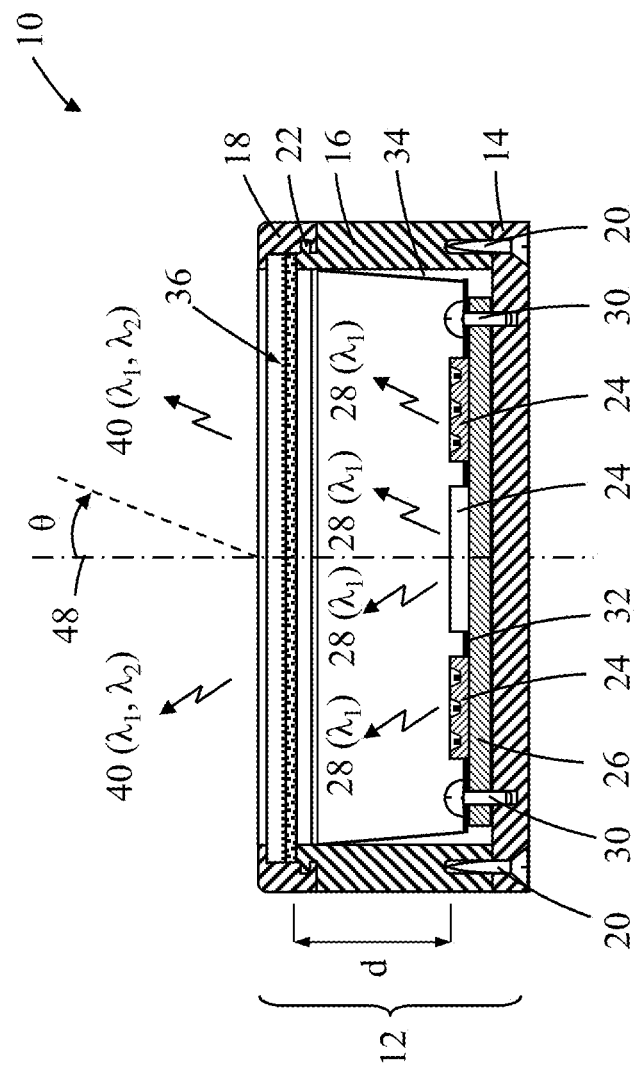

To aid in understanding the invention, this disclosure will now provide a brief description of example wavelength conversion components and lighting devices that employ such components. An example solid-state light emitting device 10 in accordance with an embodiment of the invention will now be described with reference to FIGS. 1A and 1B which shows schematic partial cutaway plan and sectional views of the device. The device 10 is configured to generate warm white light with a CCT (Correlated Color Temperature) of approximately 3000K and a luminous flux of approximately 1000 lumens.

The device 10 comprises a hollow cylindrical body 12 composed of a circular disc-shaped base 14, a hollow cylindrical wall portion 16 and a detachable annular top 18. To aid in the dissipation of heat the base 14 is preferably fabricated from aluminum, an alloy of aluminum or any material with a high thermal conductivity (preferably $\geq 200 \text{ Wm}^{-1}\text{K}^{-1}$) such as for example copper, a magnesium alloy or a metal loaded plastics material. For low cost production the wall 16 and top 18 are preferably fabricated from a thermoplastics material such as HDPP (High Density Polypropylene), nylon or PMA (polymethyl acrylate). Alternatively they can be fabricated from a thermally conductive material such as aluminum or an aluminum alloy. As indicated in FIG. 1 the base 14 can be attached to the wall portion 16 by screws or bolts 20 or by other fasteners or by means of an adhesive. As further shown in FIG. 1 the top 18 can be detachably mounted to the wall portion 16 using a bayonet-type mount in which radially extending tabs 22 engage in a corresponding annular groove in the top 18.

The device 10 further comprises a plurality (four in the example illustrated) of blue light emitting LEDs 24 (blue LEDs) that are mounted in thermal communication with a circular-shaped MCPCB (metal core printed circuit board) 26. The blue LEDs 24 can comprise 4.8 W Cetus™ C1109 chip on ceramic devices from Intematix Corporation of Fremont, Calif. in which each device comprises a ceramic packaged array of twelve 0.4 W GaN-based (gallium nitride-based) blue LED chips that are configured as a rectangular array 3 rows by 4 columns. Each blue LED 24 is operable to generate blue light 28 having a peak wavelength $\lambda_1$ in a wavelength range 400 nm to 480 nm (typically 450 nm to 470 nm). As is known an MCPCB comprises a layered structure composed of a metal core base, typically aluminum, a thermally conductive/electrically insulating dielectric layer and a copper circuit layer for electrically connecting electrical components in a desired circuit configuration. The metal core base of the MCPCB 26 is mounted in thermal communication with the base 14 with the aid of a thermally conductive compound such as for example an adhesive containing a standard heat sink compound containing beryllium oxide or aluminum nitride. As shown in FIG. 1 the MCPCB can be attached to the base using screws or bolts 30.

To maximize the emission of light, the device 10 can further comprise light reflective surfaces 32, 34 that respectively cover the face of the MCPCB 26 and the inner curved surface of the top 18. Typically the light reflective surfaces 32, 34 can comprise a highly light reflective sheet material such as WhiteOptics∩ "White 97" (A high-density polyethylene fiber-based composite film) from A.L.P. lighting Components, Inc of Niles, Ill., USA. As indicated in FIG. 1 a circular disc 32 of the material can used to cover the face of the MCPCB and a strip of the light reflective material configured as a cylindrical sleeve 34 that is inserted in the housing and is configured to cover the inner surface of the housing wall portion 16.

The device 10 further comprises a photo-luminescent wavelength conversion component 36 that is operable to absorb a proportion of the blue light 28 ($\lambda_1$) generated by the LEDs 24 and convert it to light 38 of a different wavelength ($\lambda_2$) by a process of photoluminescence 36. The emission product 40 of the device 10 comprises the combined light of wavelengths $\lambda_1$, $\lambda_2$ generated by the LEDs 24 and the wavelength conversion component 36. The wavelength conversion component is positioned remotely to the LEDs 24 and is spatially separated from the LEDs a distance d that is typically at least 1 cm. In this patent specification "remotely" and "remote" means in a spaced or separated relationship. The wavelength conversion component 36 is configured to completely cover the housing 12 opening such that all light emitted by the lamp passes through the component 36. As shown the wavelength conversion component 36 can be detachably mounted to the top of the wall portion 16 using the top 18 enabling the component and emission color of the lamp to be readily changed.

The color of the emission product produced by the wavelength conversion component will depend on the photo-luminescent material composition and the quantity of photo-luminescent material per unit area in the wavelength conversion layer 36. It will be appreciated that the quantity of photo-luminescent material per unit area is dependent on the thickness $t_3$ of the wavelength conversion layer 36 and the weight loading of photo-luminescent material to binder in the photo-luminescent ink. In applications in which the emission product is white or in applications in which the emission product has a high saturation color (i.e. the emission product comprises substantially all photoluminescence generated light) the quantity of photo-luminescent material per unit area in the wavelength conversion layer 36 will typically be between 10 mg.cm$^{-2}$ and 40 mg.cm$^{-2}$. To enable printing of the wavelength conversion layer 36 in a minimum number of print passes the photo-luminescent ink preferably has as high a solids loading of photo-luminescent material to binder material as possible and preferably has a weight loading of photo-luminescent material to binder in a range 40% to 75%. For weight loadings below about 40% it is found that five or more print passes may be necessary to achieve a required photo-luminescent material per unit area. The photo-luminescent material comprises particles with an average particle size of 10 µm to 20 µm and typically of order 15 µm.

In general lighting applications the emission product will typically be white light and the photo-luminescent material can comprise one or more blue light excitable photo-luminescent materials that emit green (510 nm to 550 nm), yellow-green (550 nm to 570 nm), yellow (570 nm to 590 nm), orange (590 nm to 630 nm) or red (630 nm to 740 nm) light. The thickness $t_3$ of the wavelength conversion layer, photo-luminescent material composition and the density (weight loading) of photo-luminescent material per unit area will determine the color of light emitted by the lamp.

The photo-luminescent material can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in United States patents U.S. Pat. No. 7,575,697 B2 "Silicate-based green phosphors", U.S. Pat. No. 7,601,276 B2 "Two phase silicate-based yellow phosphors" (assigned to Intematix Corp.), U.S. Pat. No. 7,655,156 B2 "Silicate-based orange phosphors" and U.S. Pat. No. 7,311,858 B2 "Silicate-based yellow-green phosphors". The phosphor can also comprise an aluminate-based material such as is taught in co-pending patent application US2006/0158090 A1 "Novel aluminate-based green phosphors" and patent U.S. Pat. No. 7,390,437 B2 "Aluminate-based blue phosphors", an aluminum-silicate phosphor as taught in co-pending application US2008/0111472 A1 "Aluminum-silicate orange-red phosphor" or a nitride-based red phosphor material such as is taught in co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can comprise any phosphor material including nitride and/or sulfate phosphor materials, oxy-nitrides and oxy-sulfate phosphors or garnet materials (YAG).

Embodiments of the invention pertain to improved methods and systems for manufacturing the wavelength conversion component 36. Various methods may be used to controllably deposit photo-luminescent-based inks onto a substrate to manufacture the wavelength conversion component 36. Screen printing is one method for depositing ink on a substrate, although other techniques may also be used, such as for example slot die coating, spin coating, roller coating, drawdown coating or doctor blading. For the purposes of illustration, the following description will describe embodiments of the invention with respect to screen printing of photo-luminescent ink. It is noted, however, that the invention may be applied for other deposition methods as well.

During manufacturing, entire batches of the wavelength conversion components are often manufactured at the same time. Due to differences in various processing factors, it is likely that some sort of drifting will occur for various parameters associated with the manufacturing process. For example, consider a given batch of batch of wavelength conversion components that are produced one after the other in a screen printing process. This process is often implemented by depositing a clump of ink onto a mesh screen, and using a blade (or squeegee) to scrape the ink across the surface of the mesh screen. Underneath the mesh screen, the ink will therefore be deposited onto a panel (which forms a substrate for the ink).

It is likely that some continual processing drifts (e.g. with regards to changes in ink viscosity or changes to mesh properties of the mesh screen) will cause a change in the thickness of the ink that is deposited on the individual panels. For example, assume that it is desired to deposit a layer of photo-luminescent ink of exactly thickness t onto each panel. Further assume that due to processing drifts, changes in ink viscosity causes the deposited layer of ink in subsequent panels to become either thicker or thinner by a certain percentage. In an uncontrolled manufacturing environment, this type of manufacturing drift will eventually result in thickness variations for the layer of ink sufficient to create perceptible color shift problems.

However, the present invention can be used to maintain the general conformity of the panels to a given threshold quality level, even in the presence of such processing drifts. To achieve this result, a target weight is selected for the amount of ink that should be deposited onto the panels. After each panel undergoes the ink deposition process, it is weighed to check whether the actual deposited weight of ink matches the target weight. If not, then the manufacturing process is adjusted to correct for the measured difference in weight for the subsequent panel that is processed. In this way, any processing changes are caught and corrected early, before processing drifts exceed any tolerance thresholds, and while constantly monitoring and keeping the manufactured panels centered to the target weight.

Figure 2:
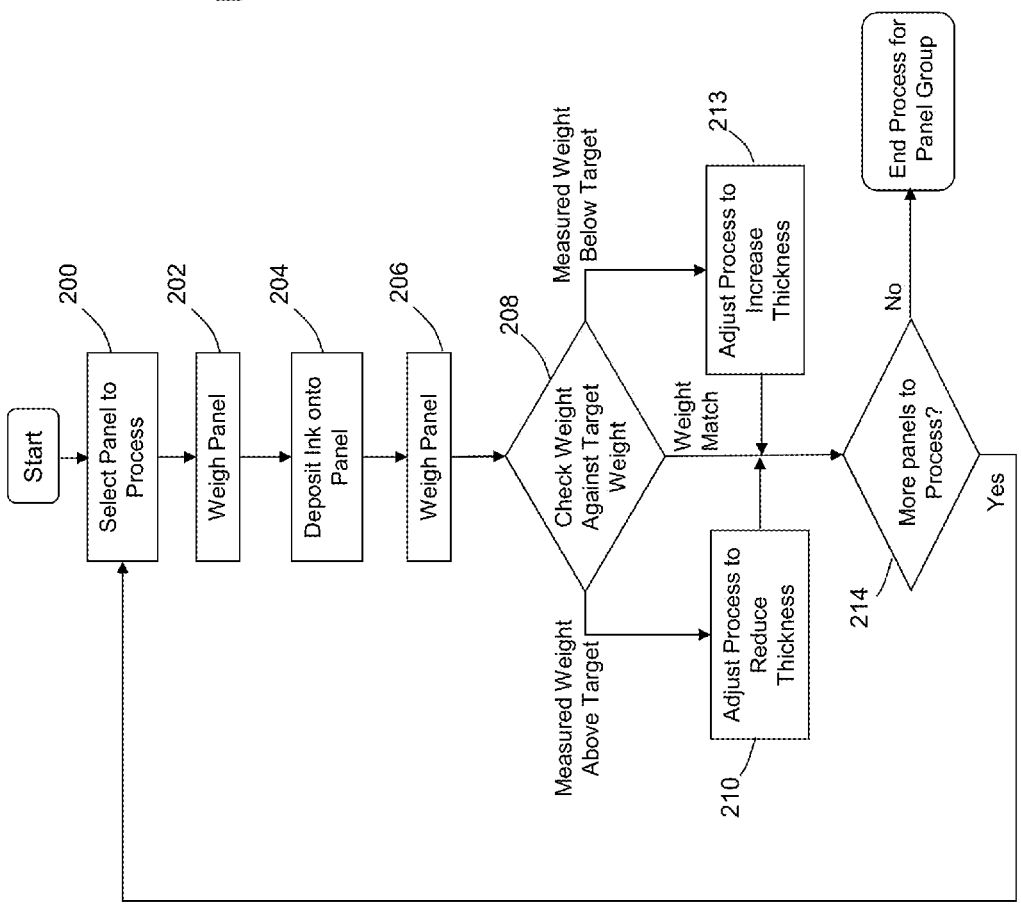
FIG. 2 is a flowchart of an approach for manufacturing photo-luminescent wavelength conversion components in accordance with an embodiment of the invention.

FIG. 2 shows a flowchart of this process. At 200, a panel from within the batch of panels is selected for ink deposition processing. At 202, the selected panel is weighed to determine the exact weight of that panel. This action is taken because it is possible that the panels do not all have an exact consistent weight (e.g. due to differences in how the panels are cut from larger panels sizes). It is noted that some sort of identification should also be associated with each panel. For example, bar codes may be used to provide the capability to individually identify each panel (and thereby provide a mechanism to associate the measured weights with each individual panel). The weight of the panel is stored into a database to track the exact weight of the panel. At this point, the weighing apparatus should "zero out" the panel weight.

At 204, the photo-luminescent ink is deposited onto the panel. The deposition is made using deposition parameters that had previously been selected to attempt to deposit the exactly correct amount of ink to meet the target weight. Such selected parameters include, for example, the speed of the blade that is used to move the ink across the mesh screen.

After the ink has been deposited, the new weight of the panel is taken at 206. At this point, at 208, the weight of the deposited ink is checked against the target weight for the ink. If the actual weight exceeds the target weight, then this means that too much ink has been deposited. On the other hand, if the actual weight is less than the target weight, then this means that too little ink was deposited. In either case, the conclusion that can be drawn is that a processing parameter needs to be adjusted to allow the printing process to meet the target weight.

If the measured weight exceeds the target weight, then at 210, the processing parameters are adjusted to reduce the thickness of the ink that is deposited onto the subsequent panel. However, if the measured weight is below the target weight, then at 213, the processing parameters are adjusted to increase the thickness of the ink that is deposited onto the next panel. The control of the amount of ink material deposited can be any type of control that allows for increasing and decreasing the amount of ink material deposited on the panel. In some embodiments, squeegee speed can be controlled to vary the amount of ink that is deposited on the panel. Some embodiments may to use squeegee pressure, heat (hotter ink becomes less viscous) or an ink replenishment system that allows adding of thinner verse thicker ink. This process could also be applied to other printing techniques like IJ printing where there is digital control available for the amount of material deposited.

Therefore, the speed at which the blade is drawn across the mesh screen can be either increased or decreased to change the amount of ink that is deposited—to increase the blade speed to increase the ink thickness and to decrease the blade speed to decrease the ink thickness. As another example, the thickeners or thinners can be injected into the ink to increase or increase the thickness of the ink layer on the panel. In addition, the blade pressure can be modified to change the thickness of the ink layer deposited onto the panel. If the measured weight matches the target weight, then the processing parameters will not be changed.

At 214, a determination is made whether there are any more panels to process in the current batch of panels. If so, then the process returns back to 200 to select another panel for processing. If not, then processing ends for the current batch of panels.

With this manufacturing approach, the feedback embodied by the weighing results allow for inline process control over the manufacturing process. This constant adjusting of deposition parameters for subsequent panels means that the panels will never be allowed to drift too far away from tolerated variations to the panel weight. In addition, the manufacturing system becomes a learning system that, over time, will be able to increase its accuracy in being able to make adjustments to address detected variations. In addition, this cycle can be used for multi-part processes. For example, as described in more detail below, if multiple layers of ink need to be deposited onto a panel, then this process can be separately used for each of the layers of ink.

One enhancement that can be taken is to measure the panels for color after they have completed manufacturing process. With adequate panel identification (e.g. using a bar code system) it is possible to correlate the actual color to the weight of the panel, and if there is refinement to be made in the target weight this can be done automatically, e.g, using control software. Therefore weight adjustments can be implemented in a self-checking manner against the final product to further improve the accuracy of later adjustments.

Figure 3:
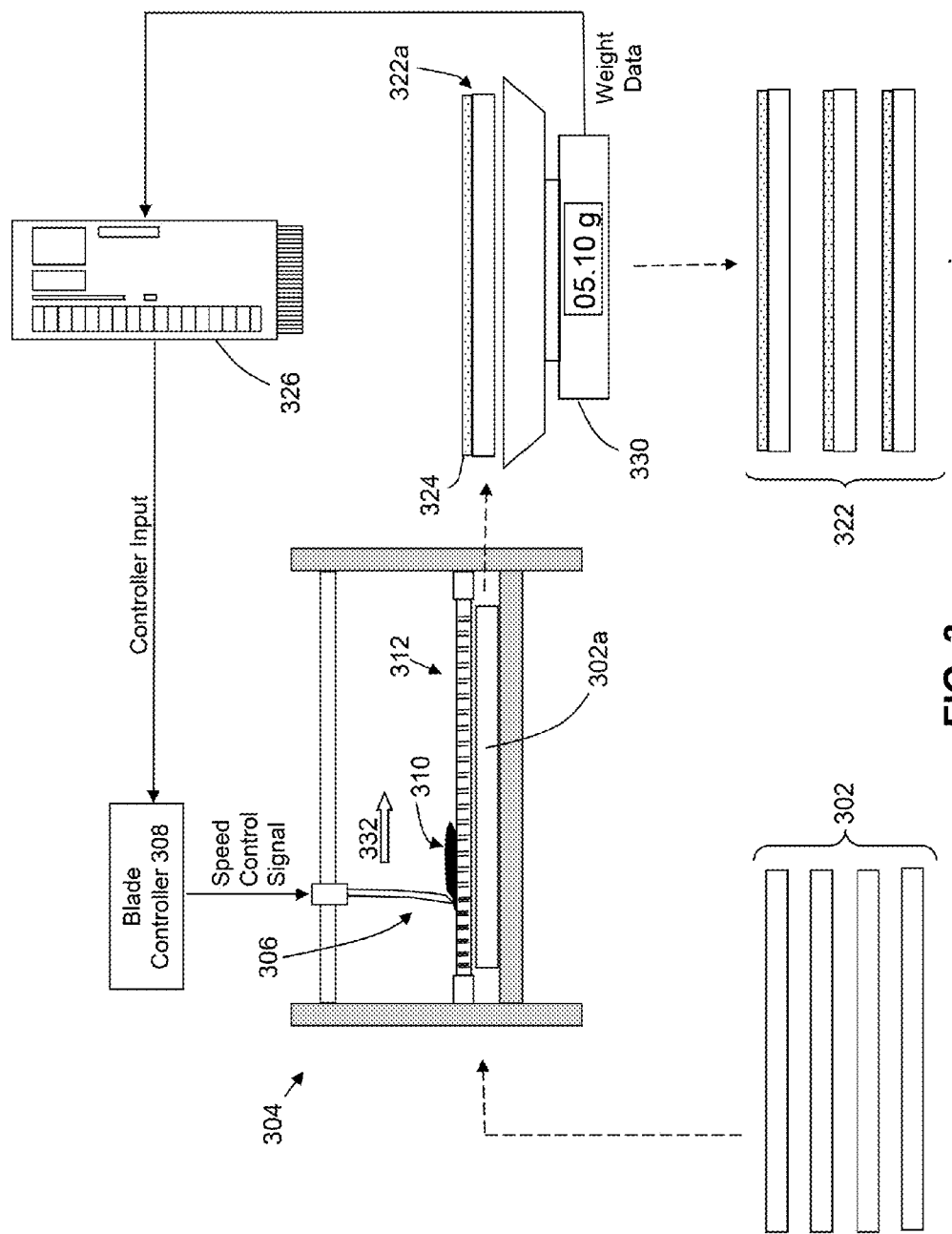
FIG. 3 illustratively shows an approach for manufacturing photo-luminescent wavelength conversion components in accordance with an embodiment of the invention.

FIG. 3 provides an illustrative example of this manufacturing process to deposit a layer of photo-luminescent ink 310 onto a batch 302 of clean panels have already been weighed and identified (e.g. bar coded). A screen printing apparatus 304 is utilized to deposit ink 310 onto a selected panel 302a. Within the screen printing apparatus 304, a blade 306 (also referred to as a squeegee) is moved at a specified speed in the direction of arrow 332 to spread the ink 310 across a mesh screen 312.

The movement speed of the blade 306 is controlled by a blade controller 308 that provides a blade control signal over a control line to control a movement motor associated with the blade 306. The blade controller is operatively managed by a control processor 326. The control processor may be implemented as a general purpose computer that is communicatively coupled to the blade controller 308, and that is programmably configured to execute the process of FIG. 2. Alternatively, the control processor may be implemented as a specialized control mechanism that is configured in either hardware and/or software to execute the process of FIG. 2.

The mesh screen 312 includes a set of very fine openings that are filled with ink 310 as the blade 306 moves across the mesh screen 312. After the blade 306 has completed a pass over the mesh screen 312 for panel 302a, the mesh screen 312 is lifted upwards in a vertical direction. The ink that had filled the fine openings in the mesh screen 312 remain on the surface of the panel 302a, and flow together to form a layer 324 of the ink 310, resulting in ink deposited panel 322a. Flow agents may be present in the ink 310 to facilitate the leveling of the ink 310 into a uniform thickness for ink layer 324 on panel 322a.

Each panel 322a that has undergone the ink deposition process will be weighed using a scale 330. The weight data is transmitted to control processor 326. The control processor 326 will compare the actual weight of panel 322a against a target weight. The control processor 326 will provide control inputs to the blade controller 308. If the measured weight exceeds the target weight, then the control input provided to the blade controller 308 will result in speed control signals being sent to the screen printing apparatus 304 to change the movement speed of blade 306 to reduce the thickness of the layer of ink 310 that is deposited onto the subsequent panel 302.

If the measured weight is below the target weight, then the control input provided to the blade controller 308 will result in speed control signals being sent to the screen printing apparatus 304 to change the movement speed of blade 306 to increase the thickness of the layer of ink 310 that is deposited onto the subsequent panel 302. For example, the speed at which the blade 306 is drawn across the mesh screen 312 can be increased to increase the ink thickness or decreased to decrease the ink thickness.

Embodiments of the invention can be applied in multiple passes to deposit multiple layers of ink onto a panel. One advantage of performing multi-pass ink deposition is that any discrepancies in weight identified during the first pass can be addressed during the second pass. The second pass processing parameters can therefore be tuned and adjusted to create a final product that matches as closely as possible to the target parameters.

Figure 4A:
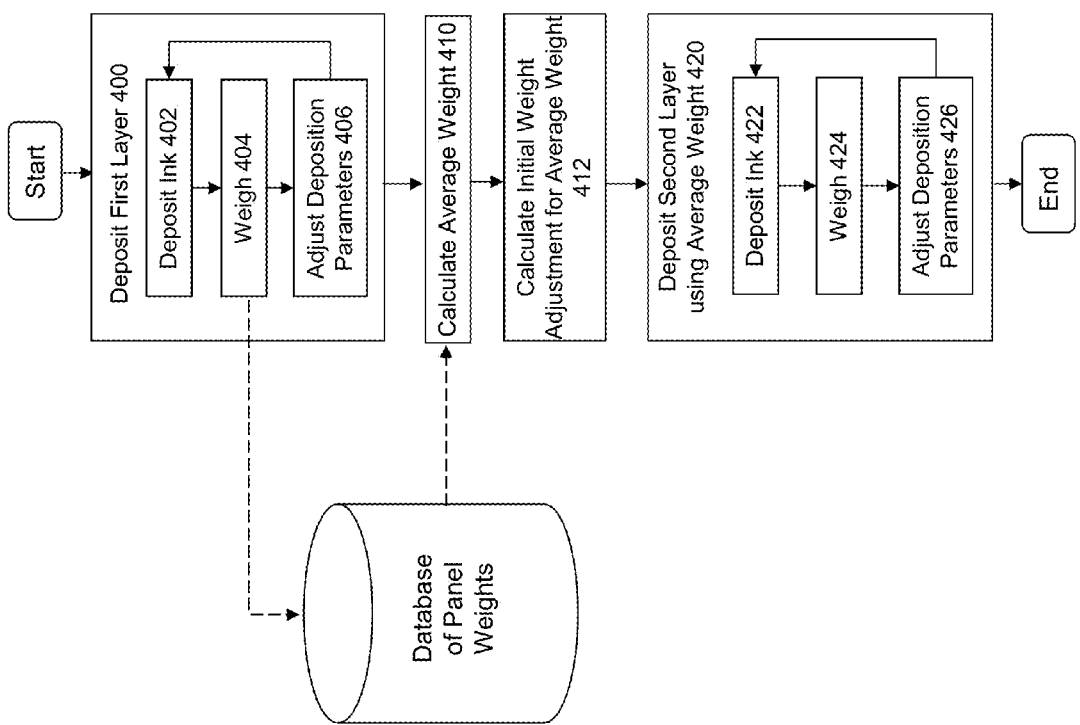
FIGS. 4A and 4B are flowcharts of multi-pass approaches for manufacturing photo-luminescent wavelength conversion components in accordance with an embodiment of the invention.

FIG. 4A shows a flowchart of an embodiment of the invention for performing multiple pass processing. At 400, a first layer of ink is deposited onto a batch of panels. To process the first layer of ink, the panels are processed one-by-one by depositing the ink (402), weighing each panel after ink deposition (404), and adjusting the deposition parameters to account for any identified differences between the measured weight and the target weight (406). These actions are implemented as described above with respect to FIGS. 2 and 3.

After the entire batch of panels has been processed, then at 410, the average weight is calculated for the panels after the first layer of ink has been deposited. At 412, calculations can be made to determine, on average, the weight processing parameters that should be applied to have the final panel meet target weight requirements after deposition of the second layer of ink.

Therefore, if the average weight of the panels after the first pass is lower than the desired target weight, then the second pass can be adjusted to deposit additional ink to attempt to have the final product match the target weight (after both ink layers have been deposited). Similarly, if the average weight of the panels after the first pass is higher than the desired target weight, then the second pass can be adjusted to deposit less ink to attempt to have the final product match the target weight after both ink layers have been deposited.

At 420, the second layer of ink is deposited onto the panels using the designated processing parameters. To process the second layer of ink, the panels are processed by depositing the ink (422), weighing each panel after ink deposition (424), and adjusting the deposition parameters to account for any identified differences between the measured weight and the target weight (426). These actions are implemented as described above with respect to FIGS. 2 and 3.

Figure 4B:
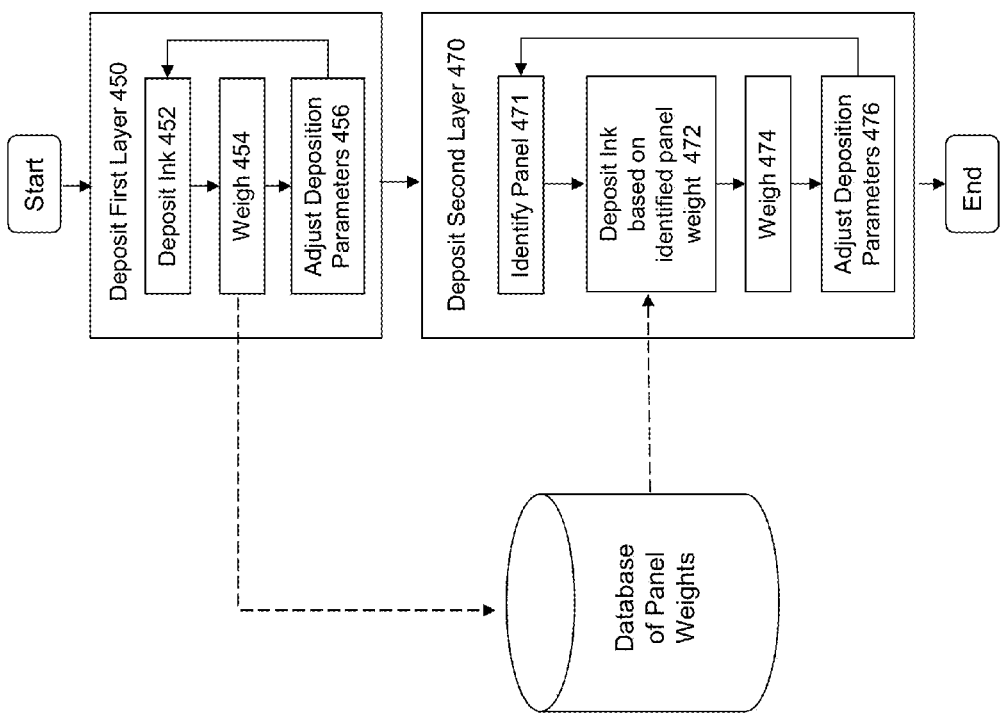

FIG. 4B shows a flowchart of an alternative embodiment of the invention for performing multiple pass processing. The difference between the approach of FIG. 4A and the approach of FIG. 4B is that the second pass of the FIG. 4B approach will adjust processing parameters specifically for each individual panel, rather than on the basis of the entire batch.

Like the approach of FIG. 4A, the first pass of FIG. 4B starts, at 450, with deposition of a first layer of ink onto a batch of panels. To process the first layer of ink, the panels are processed one-by-one by depositing the ink (452), weighing each panel after ink deposition (454), and adjusting the deposition parameters to account for any identified differences between the measured weight and the target weight (456).

However, the processing of the second pass is quite different between the approaches of FIGS. 4A and 4B. In FIG. 4B, deposition of the second layer of ink at 470 begins by identifying the specific panel that is currently being processed. The exact weight of that panel after the first pass is retrieved from a database. With that weight value for the panel, an exact determination can be made for that panel of the amount of ink that should be deposited in the second pass to have the panel exactly match the target weight. Therefore, at 472, the processing parameters are adjusted to attempt to deposit the amount of ink that is specific for this panel. At 474, the panel is weighed after the ink deposition, and the deposition parameters for the subsequent depositions can be adjusted to account for any identified differences between actual and expected weight results from the previous adjustments. This process repeats for all of the panels in the second pass.

The advantage of the approach of FIG. 4A over the approach of 4B is that no additional control equipment is required to tailor the processing parameters of the second pass to each individual panel. The advantage of the approach of FIG. 4B is that the second pass does not make general assumptions about corrections to the panels that is applied over the entire batch. Instead, each panel is individually addressed for processing in the second pass, and hence is more likely to result in panels that closely match the target specifications. Assuming no significant drifts in the manufacturing process, this means that the approach of FIG. 4A will likely produce panels within acceptable tolerances without needing to incur the expense of FIG. 4B. On the other hand, to the extent that there are tighter manufacturing tolerances that need to be met, then the approach of FIG. 4B may be the better option.

While the embodiments of FIGS. 4A and 4B show a 2-pass process, it is noted that the principles outlined herein may be applicable to processes having any number of deposition stages.

Figure 5A:
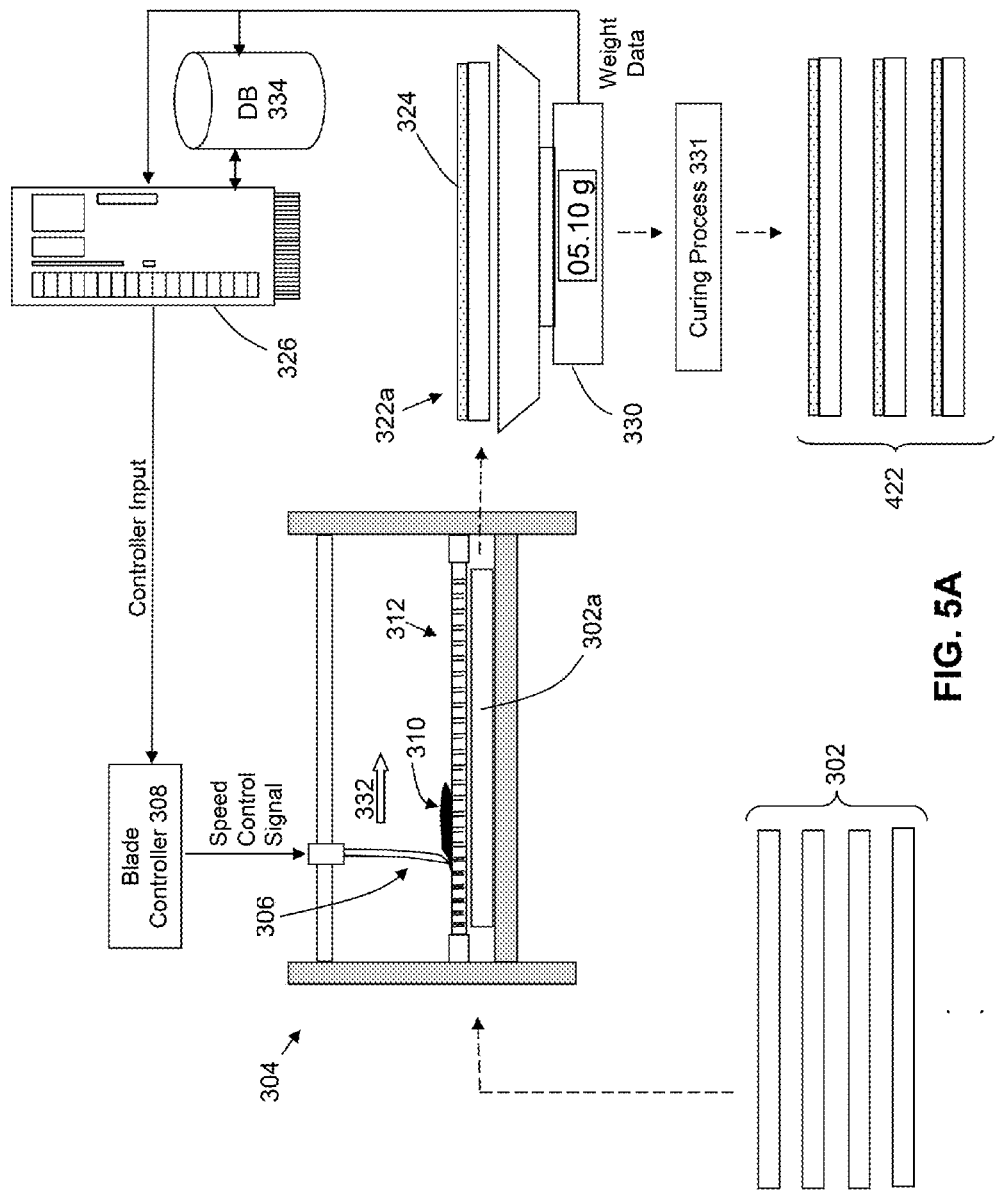
FIGS. 5A and 5B illustratively show an approach for implementing multi-pass manufacturing of photo-luminescent wavelength conversion components in accordance with an embodiment of the invention.
Figure 5B:
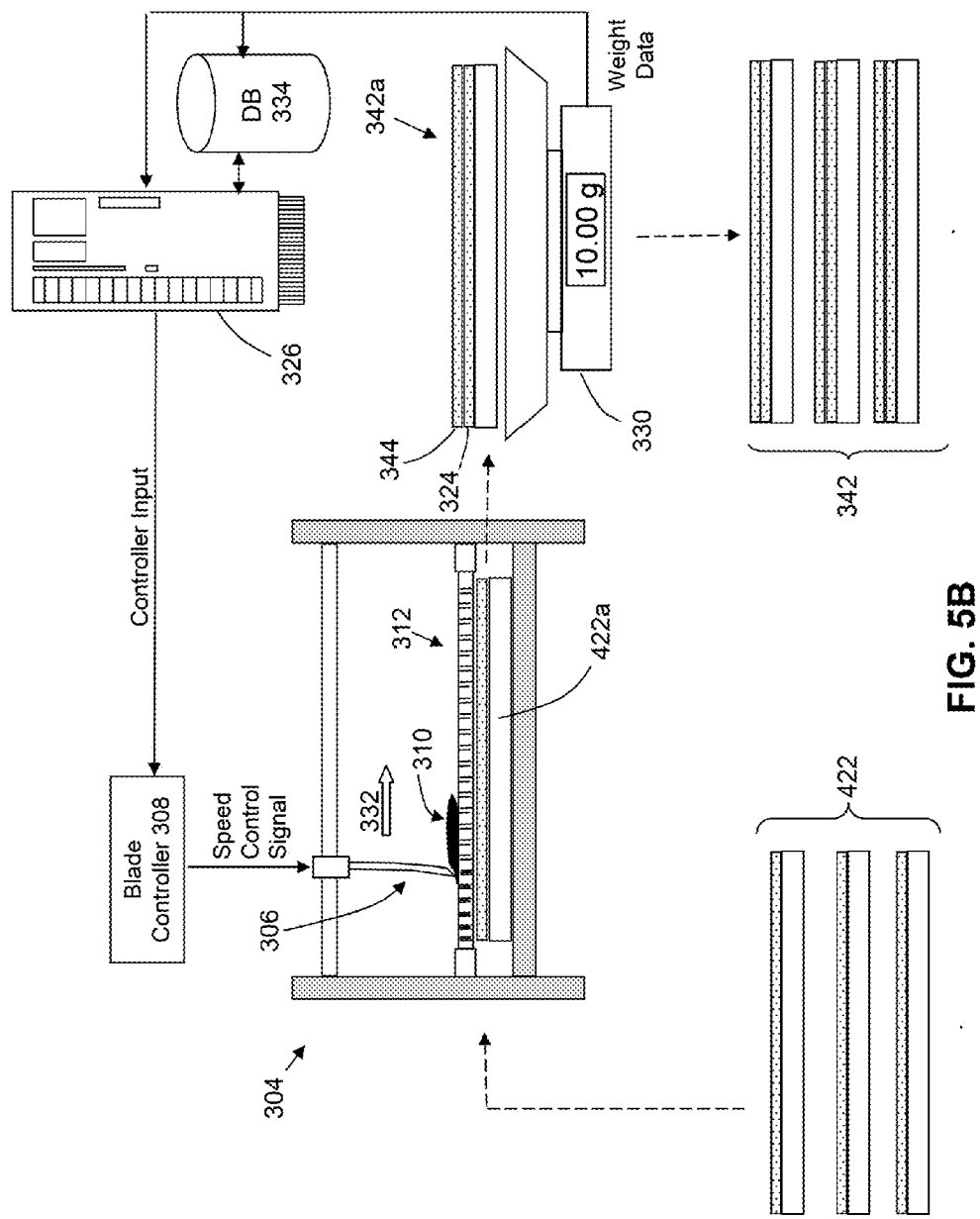

FIGS. 5A and 5B provide an illustrative example of a multi-pass manufacturing according to some embodiments of the invention. As shown in FIG. 5A, a screen printing apparatus 304 is utilized to deposit ink 310 onto a selected panel 302a. Within the screen printing apparatus 304, a blade 306 is moved at a specified speed in the direction of arrow 332 to spread the ink 310 across a mesh screen 312. The movement speed of the blade 306 is controlled by a blade controller 308 that provides a blade control signal over a control line to control a movement motor associated with the blade 306. The blade controller is operatively managed by a control processor 326. The mesh screen 312 includes a set of very fine openings that are filled with ink 310 as the blade 306 moves across the mesh screen 312. After the blade 306 has completed a pass over the mesh screen 312 for panel 302a, the mesh screen 312 is lifted upwards in a vertical direction. The ink that had filled the fine openings in the mesh screen 312 remain on the surface of the panel 302a, and flow together to form a layer 324 of the ink 310, resulting in ink deposited panel 322a.

Each panel 322a that has undergone the ink deposition process will be weighed using a scale 330. The weight data is transmitted to control processor 326. In addition, the weight data is stored into a database 334. The control processor 326 will compare the actual weight of panel 322a against a target weight. The control processor 326 will provide control inputs to the blade controller 308. If the measured weight exceeds the target weight, then the control input provided to the blade controller 308 will result in speed control signals being sent to the screen printing apparatus 304 to change the movement speed of blade 306 to reduce the thickness of the layer of ink 310 that is deposited onto the subsequent panel 302. If the measured weight is below the target weight, then the control input provided to the blade controller 308 will result in speed control signals being sent to the screen printing apparatus 304 to change the movement speed of blade 306 to increase the thickness of the layer of ink 310 that is deposited onto the subsequent panel 302.

The ink layer 324 on the panel 322a is cured in a curing process at 331. Any suitable curing process may be employed at 331, which is dependent upon the specific type of carrier material that was used to form the ink mixture. This curing process 331 prepares the panel 322a for further deposition of another layer of ink on the first ink layer 324.

FIG. 5B illustrates the deposition of the second layer of ink onto panels 322. A selected panel 322a that already has a first layer of ink 324 is placed within the screen printing apparatus 304. As before, a blade 306 is moved at a specified speed in the direction of arrow 332 to spread the ink 310 across a mesh screen 312 to deposit a second layer of ink onto panel 322a. The movement speed of the blade 306 is controlled by a blade controller 308 that provides a blade control signal over a control line to control a movement motor associated with the blade 306. After the blade 306 has completed a pass over the mesh screen 312 for panel 322a, the mesh screen 312 is lifted upwards in a vertical direction. The ink that had filled the fine openings in the mesh screen 312 remain on the surface of the panel 322a, and flow together to form a second layer 344 on top of the first layer 324 of the ink 310.

Each panel 342a that has undergone the ink deposition process will be weighed again using a scale 330. The weight data is transmitted to control processor 326. In addition, the weight data is stored into a database 334. The control processor 326 will compare the actual weight of panel 322a against a target weight. The control processor 326 will provide control inputs to the blade controller 308. If the measured weight exceeds the target weight, then the control input provided to the blade controller 308 will result in speed control signals being sent to the screen printing apparatus 304 to change the movement speed of blade 306 to reduce the thickness of the layer of ink 310 that is deposited onto the subsequent panel 302. If the measured weight is below the target weight, then the control input provided to the blade controller 308 will result in speed control signals being sent to the screen printing apparatus 304 to change the movement speed of blade 306 to increase the thickness of the layer of ink 310 that is deposited onto the subsequent panel 302.

Figure 6:
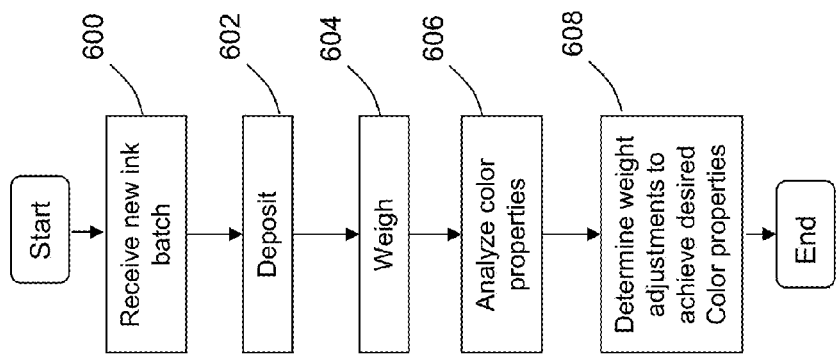
FIG. 6 is a flowchart of an approach for performing calibration for manufacturing photo-luminescent wavelength conversion components in accordance with an embodiment of the invention.

FIG. 6 is a flowchart of a process for performing a calibration process. Such calibration is useful upon certain types of changes that occur to the manufacturing process. For example, it is likely that each new batch of ink will differ enough from prior batches such that calibration will be necessary. Therefore, at 600, the process begins with receipt of a new batch of ink. At 602, deposition of the ink is performed on a test panel. After deposition, an exact weight is obtained for the amount of ink that was deposited under current deposition parameters (e.g. current movement speed and/or pressure of the blade for a screen printing apparatus).

Next, at 606, measurement of the emission characteristics of the test panel is performed. Any suitable measurements may be obtained at this point. For example, the chromaticity (CIE X, CIE Y) values, color rendering index (CRI) and/or Correlated Color Temperature of light generated by the test panel at 606 can be obtained. These measurements results are then compared to the values for a reference product.

If the measurements of the test panel match the values for the reference product, then it is assumed that the current parameters for the manufacturing run for the new batch of ink is correct, at least initially. If, however, there is a deviation between the measured color properties and the reference color properties, then adjustments need to be made to the manufacturing process. Therefore, at 608, the required adjustments are determined to tune the manufacturing process so that the panels produced with the new batch of ink will have color properties within acceptable tolerances. For example, the movement speed of the printing apparatus may be modified at this point.

While this calibration process is described as occurring upon a specific condition (i.e. receiving a new batch of ink), it is noted that such calibration may be performed under any suitable circumstance in which calibration is needed or desired.

Figure 7:
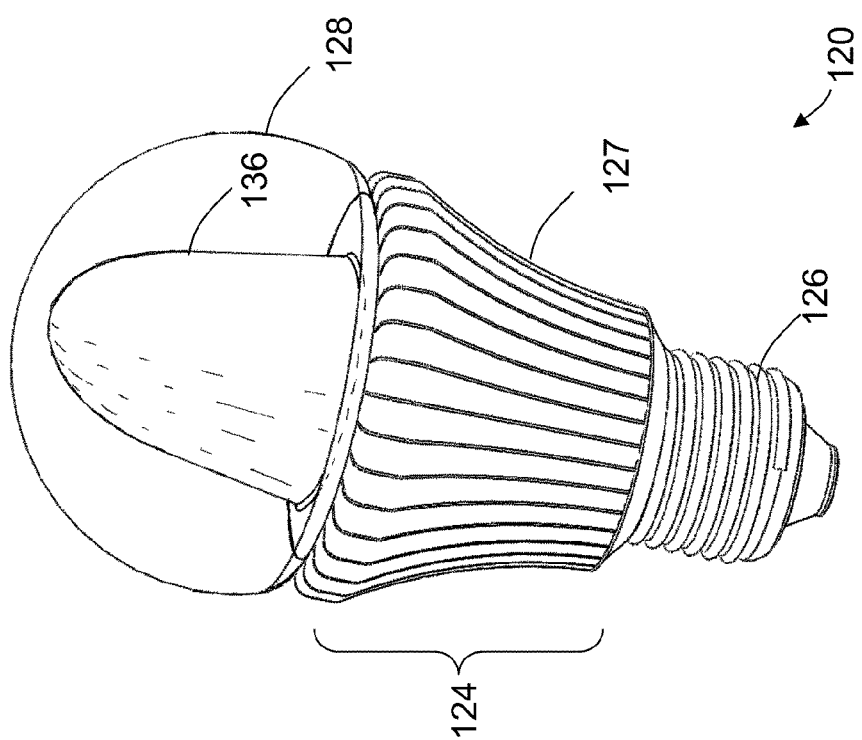
FIGS. 7 and 8 illustrate alternate wavelength conversion component shapes.
Figure 8:
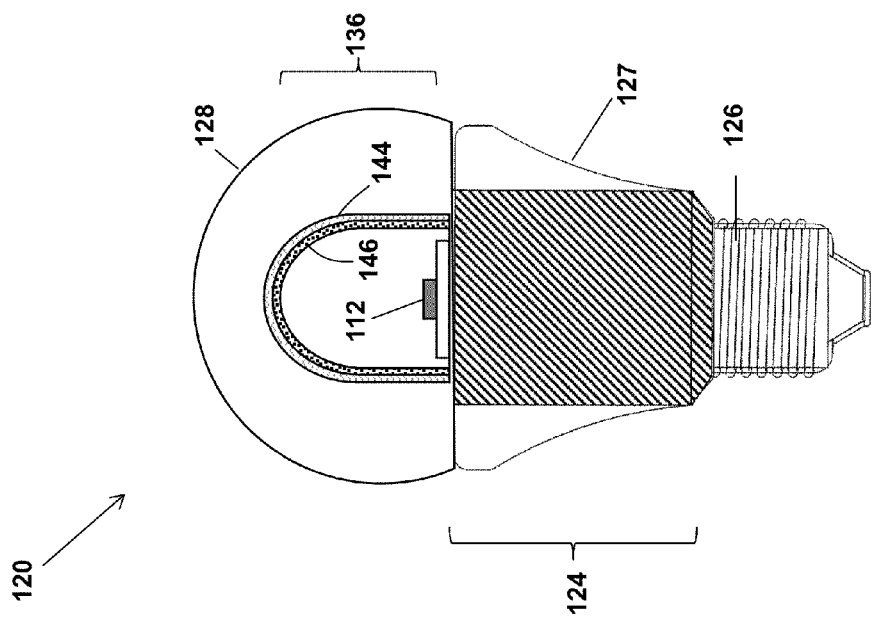

The embodiments of the invention are not limited in application only to manufacture of planar (e.g., two-dimensional or flat) wavelength conversion components. The principles described herein may be applied to the manufacture of wavelength conversion components having any type of shape. For example, consider the LED light bulb 120 illustrated in FIGS. 7 and 8 which illustrate a perspective view and a cross-sectional view of an application of an LED light bulb that utilizes a wavelength conversion component in accordance with some embodiments. The LED light bulb 120 is intended to be used as an energy efficient replacement for a conventional incandescent or fluourescent light bulb.

The light bulb 120 comprises a screw base 126 that is configured to fit within standard light bulb sockets, e.g. implemented as a standard Edison screw base. The light bulb 120 may further comprise a thermally conductive body 124 fabricated from, for example, die cast aluminum. The body 124 functions as a heat sink and dissipates heat generated by the light emitters 112, which are mounted on a MCPCB (Metal Core Printed Circuit Board). To increase heat radiation from the light bulb 120 and thereby increase cooling of the light bulb 120, the body 204 can include a series of latitudinal radially extending heat radiating fins 127.

The light bulb 120 further comprises a wavelength conversion component 136 having a three-dimensional shape, e.g., elongated dome shape shell having an interior volume defined by its inner surface that encloses the light emitters 112 within the interior volume. The three dimensional wavelength conversion component 136 includes a wavelength conversion layer 146 that has been formed on a light transmissive substrate 144.

An envelope 128 extends around the upper portion of the LED light bulb 120, enclosing the LEDs 112 and the wavelength conversion component 136. The envelope 128 is a light-transmissive material (e.g. glass or plastic) that provides protective and/or diffusive properties for the LED light bulb 120.

The three-dimensional nature of the wavelength conversion component 136 creates a relatively large shape that surrounds the interior volume around and above the LEDs 112. Using three-dimensional shapes for the wavelength conversion component 136 in a lighting device 120 allows for certain functional advantages, such as the ability to perform light shaping for the light emitted by the lighting device 120.

A molding process can be used to manufacture the wavelength conversion component 136. For example, injection molding may be employed, in which phosphor material and light-transmissive polymer material undergo a heating process that melts and mixes the phosphor material with the polymer material into a liquid, which is then injected into a mold and then cooled to form the final shape of the wavelength conversion layer 146. Hot runners may be used to ensure efficient usage of the constituent components for the molding process. Vacuum molding may also be employed to manufacture the wavelength conversion layer 146.

A weighing process as described above can be employed to make sure the proper amount of phosphor material has been placed within the wavelength conversion layer 146. If the measured weight indicates deviation from a target weight, then a process control action is taken to correct for the detected deviation, e.g., by modifying one or more process parameters of an injection molding or vacuum molding process. In this way, problematic variations in phosphor quantities for the manufactured components can be prevented.

Therefore, what has been described is an improved method and system for manufacturing wavelength conversion components. It will be appreciated that the invention is not limited to the exemplary embodiments described and that variations can be made within the scope of the invention. For example whilst the devices of the invention have been described as comprising one or more LEDs the devices can comprise other solid-state light sources such as a laser diode or laser.

What is claimed is:

1. A method of manufacturing a wavelength conversion component for a light emitting device comprising:
   depositing an ink comprising photo-luminescent material onto one or more substrates for at least one wavelength conversion component;
   weighing the one or more substrates having the ink to obtain one or more substrate weights; and
   analyzing the one or more substrate weights to determine adjustments to at least one manufacturing parameter to control an amount of the photo-luminescent material that is deposited on the at least one wavelength conversion component.

2. The method of claim 1 in which the photo-luminescent material comprises phosphor material and the ink comprises phosphor ink.

3. The method of claim 1 in which the ink is deposited using a screen printing apparatus, and wherein the at least one manufacturing parameter that is adjusted comprises a movement speed for a blade in the screen printing apparatus.

4. The method of claim 1 in which the at least one manufacturing parameter comprises at least one of deposition pressure, ink viscosity, or deposition speed.

5. The method of claim 1 in which the adjustments to the at least one manufacturing parameter is applied to a substrate that is subsequently deposited with the ink, after analysis of the one or more substrate weights.

6. The method of claim 4 in which the at least one manufacturing parameter is adjusted as an in-line process control for a batch of the at least one wavelength conversion component to be manufactured.

7. The method of claim 1 in which the adjustments to the at least one manufacturing parameter is applied in a multi-pass process, wherein a substrate is deposited with the ink in a first pass to obtain one or more substrate weights, and the adjustments to the at least one manufacturing parameter is performed in a second pass to deposit an additional layer of the ink onto the substrate.

8. The method of claim 6 in which the adjustments to the at least one manufacturing parameter is determined individually for each substrate.

9. The method of claim 6 in which the adjustments to the at least one manufacturing parameter is determined on a batch basis for a group of substrates.

10. The method of claim 1 in which the adjustments to the at least one manufacturing parameter comprises an adjustment to a vacuum molding process.

11. A system for manufacturing a wavelength conversion component for a light emitting device comprising:
    an ink deposition apparatus to deposit ink onto one or more substrates for at least one wavelength conversion component;
    a weighing apparatus to weight the one or more substrates having the ink to obtain one or more substrate weights; and
    a processor to analyze the one or more substrate weights to determine adjustments to at least one manufacturing parameter for the ink deposition apparatus to control an amount of photo-luminescent material that is deposited on the at least one wavelength conversion component.

12. The system of claim 11 in which the ink deposition apparatus is a screen printing apparatus, and wherein the at least one manufacturing parameter that is adjusted comprises a movement speed for a blade in the screen printing apparatus.

13. The system of claim 11 in which the at least one manufacturing parameter comprises at least one of deposition pressure, ink viscosity, or deposition speed.

14. The system of claim 11 in which the adjustments to the at least one manufacturing parameter is applied to a substrate that is subsequently deposited with the ink, after analysis of the one or more substrate weights.

15. The system of claim 14 in which the at least one manufacturing parameter is adjusted as an in-line process control for a batch of the at least one wavelength conversion component to be manufactured.

16. The system of claim 11 in which the adjustments to the at least one manufacturing parameter is applied in a multi-pass process, wherein a substrate is deposited with the ink in a first pass to obtain one or more substrate weights, and the adjustments to the at least one manufacturing parameter is performed in a second pass to deposit an additional layer of the ink onto the substrate.

17. The system of claim 16 in which the adjustments to the at least one manufacturing parameter is determined individually for each substrate.

18. The system of claim 16 in which the adjustments to the at least one manufacturing parameter is determined on a batch basis for a group of substrates.

19. A wavelength conversion component manufactured in accordance with claim 1.

* * * * *